(12) United States Patent
Yun

(10) Patent No.: US 7,847,743 B2
(45) Date of Patent: Dec. 7, 2010

(54) METHOD FOR MEASURING INVERSE SCATTERING WAVE, AND APPARATUS FOR IDENTIFYING INFERIOR RFID TRANSPONDER AND READER USING THE SAME

(75) Inventor: Je-Hoon Yun, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 355 days.

(21) Appl. No.: 12/096,670

(22) PCT Filed: Dec. 11, 2006

(86) PCT No.: PCT/KR2006/005376

§ 371 (c)(1),
(2), (4) Date: Jun. 9, 2008

(87) PCT Pub. No.: WO2007/067017

PCT Pub. Date: Jun. 14, 2007

(65) Prior Publication Data

US 2008/0297423 A1    Dec. 4, 2008

(30) Foreign Application Priority Data

Dec. 9, 2005    (KR) ............... 10-2005-0120460

(51) Int. Cl.
*G01R 29/10* (2006.01)
(52) U.S. Cl. .................................. 343/703
(58) Field of Classification Search ......... 343/703; 356/479; 367/8
See application file for complete search history.

(56) References Cited

U.S. PATENT DOCUMENTS 5,031,154 A * 7/1991 Watanabe ............... 367/8

(Continued)

FOREIGN PATENT DOCUMENTS

JP       05-045393       2/1993

(Continued)

OTHER PUBLICATIONS

William B. Weir, et al; "Broadband Automated Radar Cross Section Measurements," IEEE Transactions on Antennas and Propagation, vol. AP-22, No. 6, pp. 780-784, Nov. 1974.

(Continued)

*Primary Examiner*—Hoang V Nguyen
(74) *Attorney, Agent, or Firm*—Ladas & Parry LLP

(57) ABSTRACT

Provided is a method for measuring inverse scattering wave, which includes installing a scattering object which is a test object in a coupler, feeding an electrical signal to an input terminal of the coupler, terminating an output terminal and an isolation terminal of the coupler so that the electrical signal scattered by colliding with the scattering object is transmitted to a coupling terminal of the coupler, and measuring intensity of the electrical signal transmitted to the coupling terminal. In addition, provided is an apparatus for identifying an inferior Radio Frequency IDentification (RFID) transponder and an inferior RFID reader by using the method for measuring the inverse scattering wave. Accordingly, the installation cost thereof is reduced. Furthermore, the facilities for the measurement can be installed in a narrow space, and the measurement can be done regardless of an external electromagnetic wave environment. Moreover, the apparatus for identifying the inferior RFID transponder and reader is installed on a production line, thereby removing the inferior RFID transponder and reader directly from the production line during the mass production.

17 Claims, 9 Drawing Sheets

U.S. PATENT DOCUMENTS 6,114,860 A  9/2000  Yun
6,456,070 B1  9/2002  Kazama et al.
6,611,338 B1 *  8/2003  Knuttel et al. .............. 356/479

FOREIGN PATENT DOCUMENTS

| JP | 07-311312 | 11/1995 |
|---|---|---|
| JP | 08-122379 | 5/1996 |
| JP | 09-318529 | 12/1997 |
| JP | 10-332754 | 12/1998 |
| KR | 1989-0014990 | 10/1989 |
| KR | 1019960024261 | 7/1996 |
| KR | 100238446 | 10/1999 |
| WO | 2004/072892 | 8/2004 |

OTHER PUBLICATIONS

International Search Report mailed Mar. 19, 2007; PCT/KR2006/005376.

* cited by examiner

METHOD FOR MEASURING INVERSE SCATTERING WAVE, AND APPARATUS FOR IDENTIFYING INFERIOR RFID TRANSPONDER AND READER USING THE SAME

This application is a 371 of PCT/KR2006/005376 dated Dec. 11, 2006.

TECHNICAL FEILD

The present invention relates to a method for measuring inverse scattering wave and an apparatus for identifying an inferior Radio Frequency IDentification (RFID) transponder and reader using the same. More particularly, the invention relates to a method which measures an inverse scattering characteristic by installing a test object such as an RFID transponder in a coupler and generating inverse scattering wave in the coupler, and an apparatus for identifying an inferior RFID transponder and reader by being installed on a production line and by using the measuring method so as to remove the inferior RFID transponder and reader during the mass production.

BACKGROUND ART

A technique of measuring electromagnetic wave generated by scattering is dependent upon a technique of measuring electromagnetic wave by installing an isolation antenna capable of isolating a transmitting signal and a receiving signal in an outdoor test station having a radio wave absorbent on its bottom, or a radio dark room having a radio wave absorbent on its ceiling, sidewall and bottom.

On the other hand, an inverse scattering measurement must satisfy a far field condition, and thus, an antenna and a test object must be spaced far from each other.

Therefore, a large radio dark room is necessary, and electromagnetic wave is generated and received through the antenna, thereby restricting a bandwidth, which is a general problem of the antenna. In addition, a phase linear response to a frequency is not guaranteed in a broadband. Especially, the size of the antenna is very large in a low frequency band, which is very difficult to measure inverse scattering in a low frequency.

Furthermore, in case of implementing an isolation antenna for measuring inverse scattering, a transmitting antenna and a receiving antenna must be installed adjacently to each other. Moreover, interference wave scattered from accidental scattering objects (such as receiving antenna, transmitting/receiving antenna cable, signal generator, receiver, etc.) except its adjacent test object may be mixed with an original signal, thereby making it difficult to embody the measurement system.

To solve the above problem, a technique of removing an interference wave signal is applied to a receiver in which the receiving antenna is installed. However, this technique requires very high-priced facilities and circuit system, and is very sensitive to environmental variations of the radio dark room. Therefore, if there is a change in the surrounding environment, it is difficult to ensure that the signal has been scattered directly from the test object. In addition, reproducibility and accuracy in measurement are low. Also, since the radio wave absorbent must be installed on all of the bottom, sidewall and ceiling of the radio dark room, the installation space is inevitably enlarged to satisfy the far field condition, which increases expenses.

Besides, the outdoor test station is also affected by the external electromagnetic wave environment.

As a result, the above-mentioned prior art does not embody the method for measuring the inverse scattering wave, which can measure performance of an RFID transponder or reader in a narrow space such as a production line, regardless of the external electromagnetic wave environment.

DISCLOSURE OF INVENTION

Technical Problem

It is, therefore, an object of the present invention to provide a method which measures an inverse scattering characteristic by installing a test object such as an RFID transponder in a coupler and generating inverse scattering wave in the coupler.

Another object of the present invention is to provide an apparatus for identifying an inferior RFID transponder and reader by being installed on a production line and by using the method for measuring the inverse scattering wave so as to remove the inferior RFID transponder and reader during the mass production.

The other objectives and advantages of the invention will be understood by the following description and will also be appreciated by the embodiments of the invention more clearly. Further, the objectives and advantages of the invention will readily be seen that they can be realized by the means and its combination specified in the claims.

Technical Solution

In accordance with one aspect of the present invention, there is provided a method for measuring inverse scattering wave, including the steps of: installing a scattering object which is a test object in a coupler; feeding an electrical signal to an input terminal of the coupler; terminating an output terminal and an isolation terminal of the coupler so that the electrical signal scattered by colliding with the scattering object is transmitted to a coupling terminal of the coupler; and measuring intensity of the electrical signal transmitted to the coupling terminal.

Further, it is preferred that the electrical signal is an RF power signal.

Furthermore, it is advantageous that the coupler is configured in such a manner that uniformity of electromagnetic wave is high in ⅓ center portion between inner conductors provided in the coupler.

Also, it is preferred that the electrical signal is measured by using any one of a 2-terminal GTEM cell, a CTL cell, a strip line cell and an 8-terminal TEM cell which have a coupler structure.

In accordance with another aspect of the present invention, there is provided a method for measuring forward scattering wave, including the steps of: installing a scattering object which is a test object in a coupler; feeding an electrical signal to an input terminal of the coupler; terminating an output terminal and a coupling terminal of the coupler so that the electrical signal scattered by colliding with the scattering object is transmitted to an isolation terminal of the coupler; and measuring intensity of the electrical signal transmitted to the isolation terminal.

Further, it is preferred that the electrical signal is an RF power signal.

Moreover, it is advantageous that the electrical signal is measured by using any one of a 2-terminal GTEM cell, a CTL cell, a strip line cell and an 8-terminal TEM cell which have a coupler structure.

In accordance with still another aspect of the present invention, there is provided an apparatus for identifying an inferior passive RFID transponder, including: attenuators connected to each of an input terminal and an output terminal of a coupler; a passive RFID reader, which is normally operated, connected to the attenuators; and a passive RFID transponder, which is a test object, installed in the coupler, whereby an inferior product is identified by using the method for measuring the inverse scattering wave; and there is further provided an apparatus for identifying an inferior active RFID transponder, including: attenuators connected to each of an input terminal and an output terminal of a coupler; a circulator connected to the attenuators; an active RFID reader, which is normally operated, connected to the circulator; and an active RFID transponder, which is a test object, installed in the coupler, whereby an inferior product is identified by using the method for measuring the inverse scattering wave.

In accordance with still yet another aspect of the present invention, there is provided an apparatus for identifying an inferior passive RFID reader, including: a passive transponder, which is normally operated, installed in a coupler; attenuators connected to each of an input terminal and an output terminal of the coupler; and an RFID reader, which is a test object, installed in the attenuators, whereby an inferior product is identified by using the method for measuring the inverse scattering wave; and there is further provided an apparatus for identifying an inferior active RFID reader, including: an active transponder, which is normally operated, installed in a coupler; attenuators connected to each of an input terminal and an output terminal of the coupler; a circulator connected to the attenuators; and an active RFID reader, which is a test object, installed in the circulator, whereby an inferior product is identified by using the method for measuring the inverse scattering wave.

Advantageous Effects

As discussed earlier, in accordance with the present invention, the method for measuring the inverse scattering wave measures the inverse scattering characteristic by installing the test object such as the RFID transponder in the coupler, and generating the inverse scattering wave in the coupler, thereby reducing the installation cost and installing the measurement system in a narrow space. Accordingly, it is possible to conduct the measurement, regardless of the external electromagnetic wave environment.

In addition, the apparatus for identifying the inferior RFID transponder and reader by using the method for measuring the inverse scattering wave is installed on the production line, thereby removing the inferior RFID transponder and reader directly from the production line during the mass production.

BRIEF DESCRIPTION OF THE DRAWINGS

The above and other objects and features of the present invention will become apparent from the following description of the preferred embodiments given in conjunction with the accompanying drawings, in which.

BEST MODE FOR CARRYING OUT THE INVENTION

Hereinafter, preferred embodiments of the present invention will be set forth in detail with reference to the accompanying drawings.

FIGS. 1 through 21 illustrate a method for measuring inverse scattering wave and an apparatus for identifying an inferior RFID transponder and reader using the same in accordance with the present invention.

Figure 1:
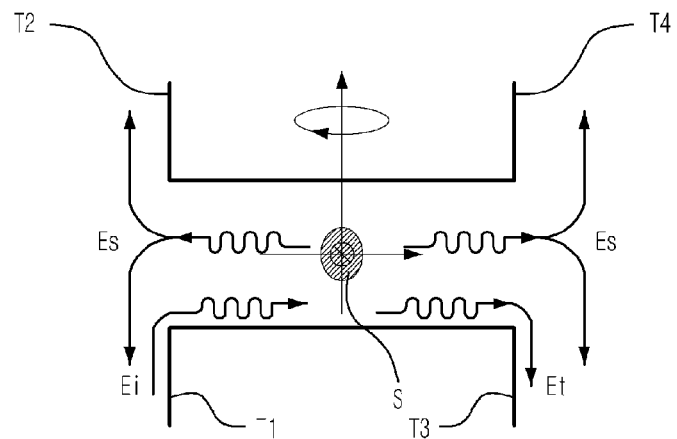
FIG. 1 is a schematic view describing a principle of measuring inverse scattering wave using a coupler in accordance with a first embodiment of the present invention.

In accordance with a first embodiment of the present invention, as illustrated in FIG. 1, a method for measuring inverse scattering wave installs a scattering object S which is a test object in a coupler, feeds an electrical signal to an input terminal T1 of the coupler, terminates an output terminal T3 and an isolation terminal T4 of the coupler so that the electrical signal scattered by colliding with the scattering object S can be transmitted to a coupling terminal T2 of the coupler, and measures intensity of the electrical signal transmitted to the coupling terminal T2.

In the measuring method, it is preferred that the electrical signal is an RF power signal.

When the scattering object S such as an RFID transponder, which is the test object, is installed at the center of the coupler and the electrical signal is fed to the input terminal T1 of the coupler, the scattering object S is exposed to a Transverse Electro Magnetic (TEM) mode (wave impedance 377 W) similar to plane wave induced in the coupler, and scattering wave is converted into an RF power signal and transmitted to the input terminal T1, the coupling terminal T2, the output terminal T3 and the isolation terminal T4.

In the above arrangement, if the coupler has a small coupling quantity, the intensity of the RF electrical signal coupled by incident wave Ei is very small. Therefore, the RF electrical signal transmitted to the coupling terminal T2 will be deemed to have been generated by inverse scattering wave.

Except the intensity, the electrical signal has the same characteristic as the inverse scattering wave generated by the plane wave in a free space.

An inverse scattering quantity of the test object S can be measured by using correlation between the electromagnetic wave transmitted to the coupling terminal T2 and inverse scattering wave generated by a general isolation antenna [see Eq. (1) to be described later].

Preferably, the coupler is designed in a manner that uniformity of the electromagnetic wave is high in ⅓ center portion between inner conductors provided in the coupler.

On the other hand, a quantity of forward scattering wave can be measured in the isolation terminal T4 in the same principle as the coupling terminal T2.

That is, a method for measuring forward scattering wave installs a scattering object S which is a test object in a coupler, feeds an electrical signal to an input terminal T1 of the coupler, terminates an output terminal T3 and a coupling terminal T2 of the coupler so that the electrical signal scattered by colliding with the scattering object S can be transmitted to an isolation terminal T4 of the coupler, and measures intensity of the electrical signal transmitted to the isolation terminal T4.

In the measuring method, the electrical signal is an RF power signal.

For reference, a characteristic parameter of the inverse scattering wave is a Radar Cross Section (RCS).

To embody the aforementioned technique, as shown in FIG. 1, the test object S intended to be measured is installed at the center portion having a uniform electromagnetic field between conductor plates installed in the coupler, the output terminal T3 and the isolation terminal T4 of the coupler are terminated, and the RF power signal is inputted to the input terminal T1.

The incident wave Ei is formed in the coupler due to feeding of the signal to the input terminal T1, and collides with the test object S, thereby generating scattering wave Es.

The scattering wave Es is transmitted to each terminal. Thus, the inverse scattering performance can be measured by using the signal transmitted to the coupling terminal T2.

Since reflected wave generated by a mismatching characteristic of the coupler itself and the incident wave Ei coexist in the input terminal T1, it is difficult to measure the scattering wave Es only. Further, as shown in FIG. 1, since non-scattered wave Et is transmitted to the output terminal T3 at the same time, it is difficult to individually measure the scattering wave Es.

Accordingly, it is advantageous to measure performance of the inverse scattering wave by measuring only the intensity of the electrical signal transmitted to the coupling terminal T2.

In the coupler used for measuring the inverse scattering performance, an important issue is that uniformity of the electromagnetic wave must be secured in the test area in which the inverse scattering object is installed.

This is because reproducibility and accuracy in measurement can be acquired by high uniformity of the electromagnetic wave.

The representative facilities of the TEM line having the coupler structure with the uniform area include a 2-terminal Gigahertz TEM (GTEM) cell, a Coupled Transmission Line (CTL) cell, a strip line cell, an 8-terminal TEM cell and a 6-terminal TEM cell.

In the method for measuring the inverse scattering wave and the method for measuring the forward scattering wave as mentioned above, the electrical signal is measured by using any one of the 2-terminal GTEM cell, the CTL cell, the strip line cell and the 8-terminal TEM cell which have the coupler structure.

Figure 2:
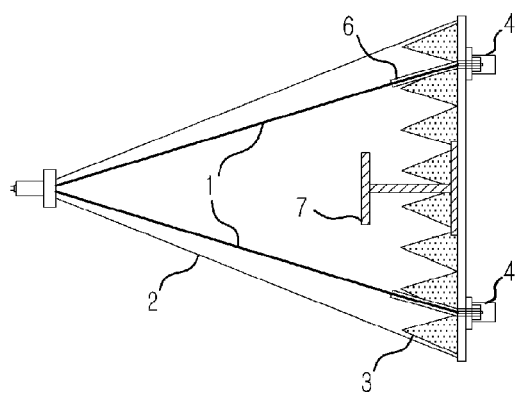
FIG. 2 is a front view of a 2-terminal GTEM cell which does not have a distribution resistance plate.

FIG. 2 illustrates a front view of a 2-terminal GTEM cell which does not have a distribution resistance plate.

An outer conductor 2 is formed in a hollow rectangular conical shape, and two inner conductors 1 are installed in the outer conductor 2 to face each other.

The 2-terminal GTEM cell includes two Input/Output (I/O) terminals, and also includes radio wave absorbents 3, impedance matching plates 6 and terminators 4 at the end.

In the general 2-terminal GTEM cell, the distribution resistance plate is installed at the ending points of the inner conductors to terminate a low frequency band. However, this method is embodied in a manner that a plurality of resistance elements is connected in series and in parallel on a large PCB board, thereby increasing the production cost. To solve the foregoing problem, it is designed in such a way that the impedance matching plates 6 made of metal are installed inside, the width of the inner conductors 1 is reduced to maintain impedance matching in order to keep characteristic impedance constant, and the final ends are connected to the terminators 4.

Figure 3:
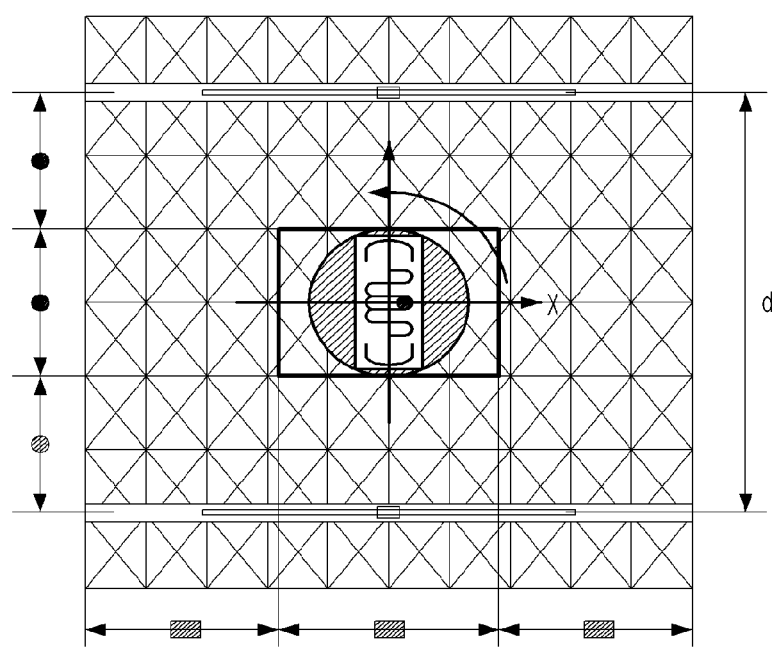
FIG. 3 is a side view of the 2-terminal GTEM cell which does not have the distribution resistance plate.

FIG. 3 shows a side view of the 2-terminal GTEM cell which does not have the distribution resistance plate, especially, setting of a test area.

Uniformity of electromagnetic wave must exist in a predetermined range (+/−3dB in EMS) in ⅓ center portion between the inner conductors and the outer conductor or between the inner conductors. Such an area is called a uniform area.

As the uniformity of the electromagnetic wave increases, reproducibility and accuracy in measurement are improved.

There is provided one example where an RFID transponder which is an inverse scattering object is installed in the uniform area 8. This area is defined in International Standardization IEC61000-4.

Figure 4:
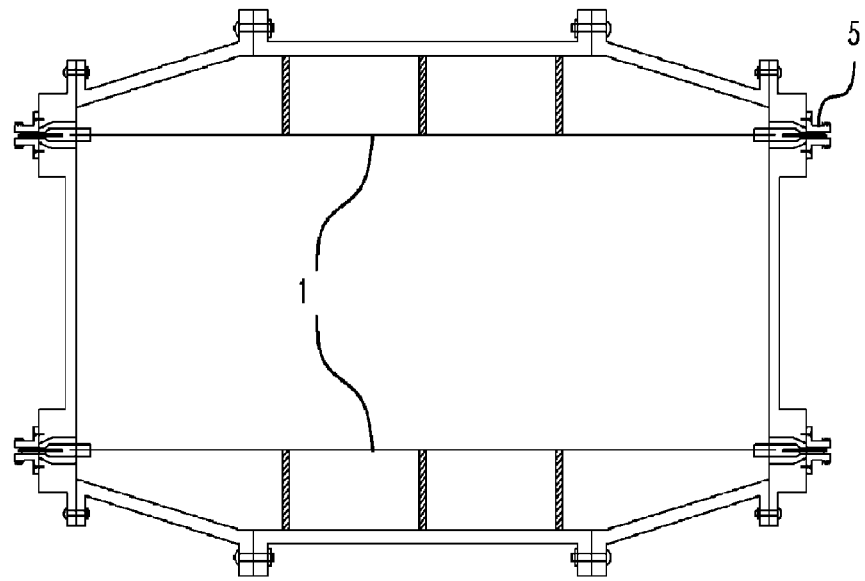
FIG. 4 is a front view of a CTL cell.
Figure 5:
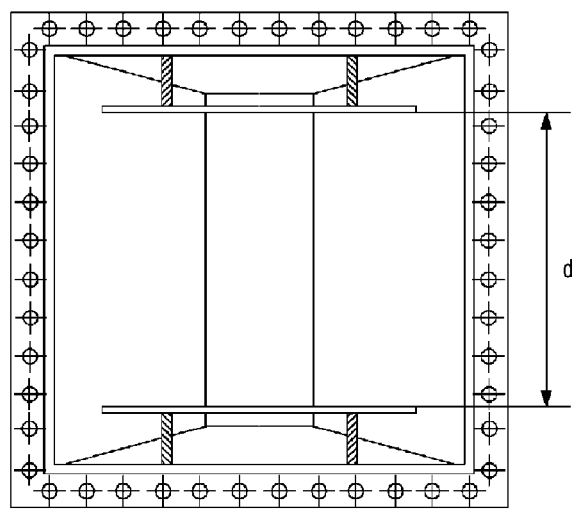
FIG. 5 is a side view of the CTL cell.

FIGS. 4 and 5 present a front view and a side view of a general CTL cell, respectively.

From the drawings, it can be seen that the CTL cell has a coupler structure including two inner conductors 2.

The great differences between the 2-terminal GTEM cell and the CTL cell are that the latter is more restricted in a usable frequency band than the former, but more cheap in the production cost and smaller than the former.

Figure 6:
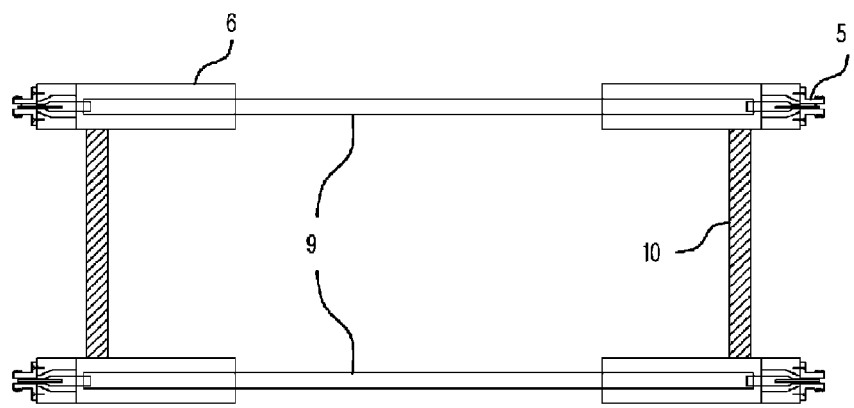
FIG. 6 is a front view of a strip line cell.
Figure 7:
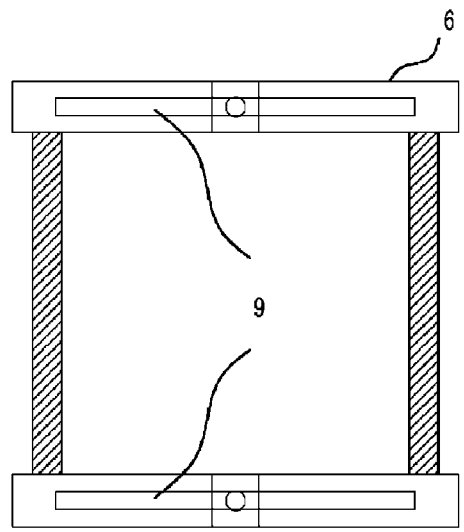
FIG. 7 is a side view of the strip line cell.

FIGS. 6 to 9 illustrate models having different coupler structures and capable of securing the uniform area, wherein FIGS. 6 and 7 show the strip line cell. These structures show that conductor plates 9 are installed to face each other, dielectric supports 10 made of a nonconductor are installed to support the conductor plates 9, and impedance matching plates 6 for impedance matching are installed in the narrow width portions of the conductor plates 9.

Although the aforementioned models are more advantageous in easy production and low cost than the models of FIGS. 2 to 5, those models are affected by the external electromagnetic wave environment, and cause electromagnetic wave interferences to other peripheral devices during the test.

Figure 8:
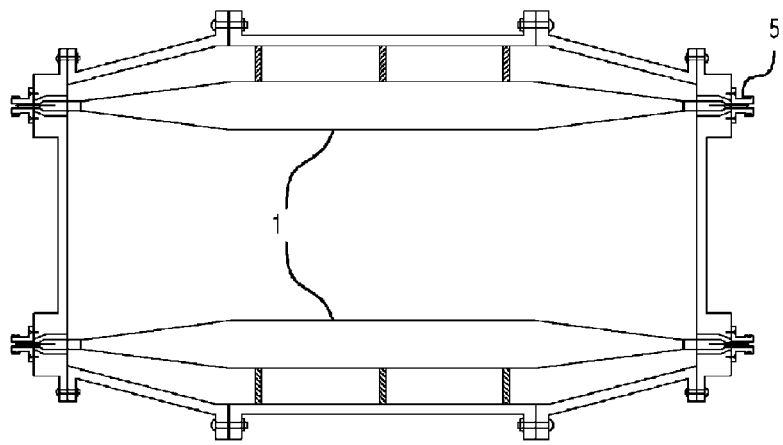
FIG. 8 is a front view of an 8-terminal TEM cell.
Figure 9:
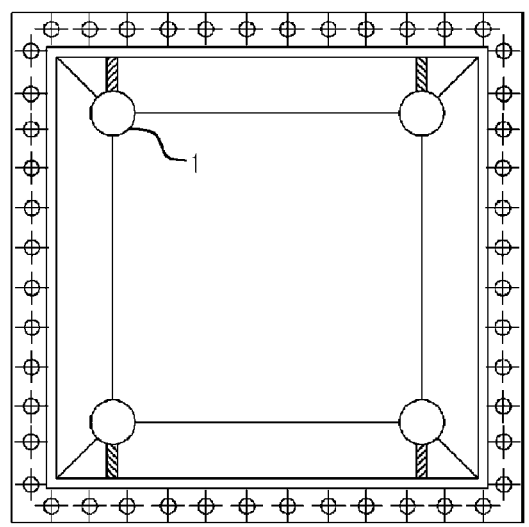
FIG. 9 is a side view of the 8-terminal TEM cell.

FIGS. 8 and 9 describe a front view and a side view of an 8-terminal TEM cell, respectively. This 8-terminal TEM cell includes four inner conductors 1 and the two facing inner conductors 1 form a same phase feeding structure. Therefore, it can be seen that the 8-terminal TEM cell has the coupler structure.

If a section size of an outer conductor of the 8-terminal TEM cell is identical to that of the CTL cell of FIGS. 4 and 5, the 8-terminal TEM cell has a wider uniform area 8. However, the 8-terminal TEM cell requires an in-phase feeding circuit to utilize in measuring inverse scattering.

Figure 10:
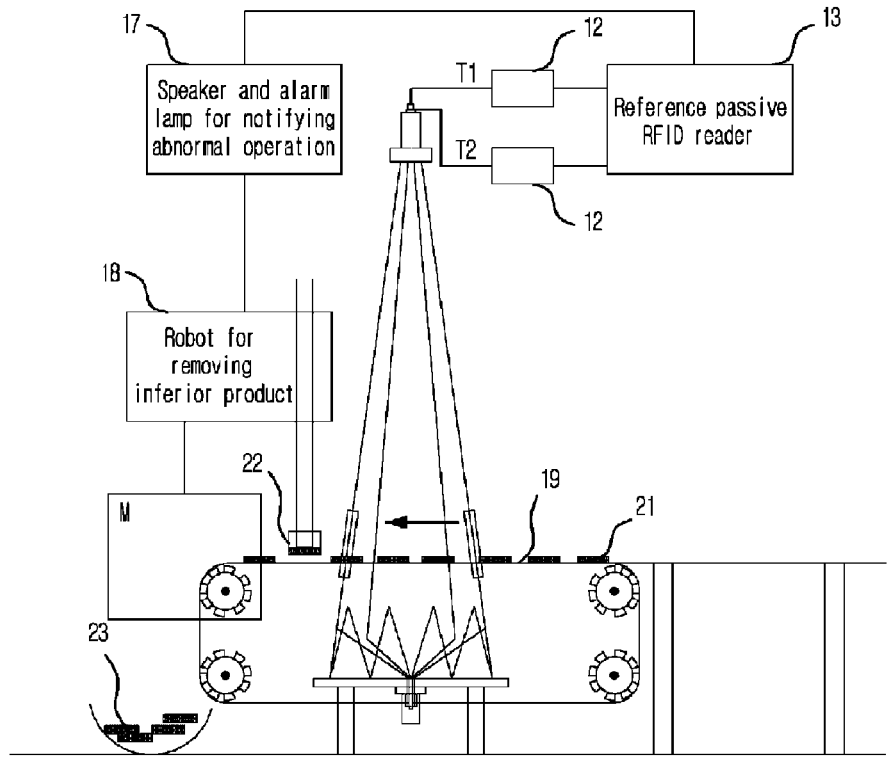
FIG. 10 is a schematic view illustrating an apparatus for identifying an inferior passive RFID transponder using a 2-terminal GTEM cell which does not have a distribution resistance plate in accordance with a second embodiment of the present invention.
Figure 11:
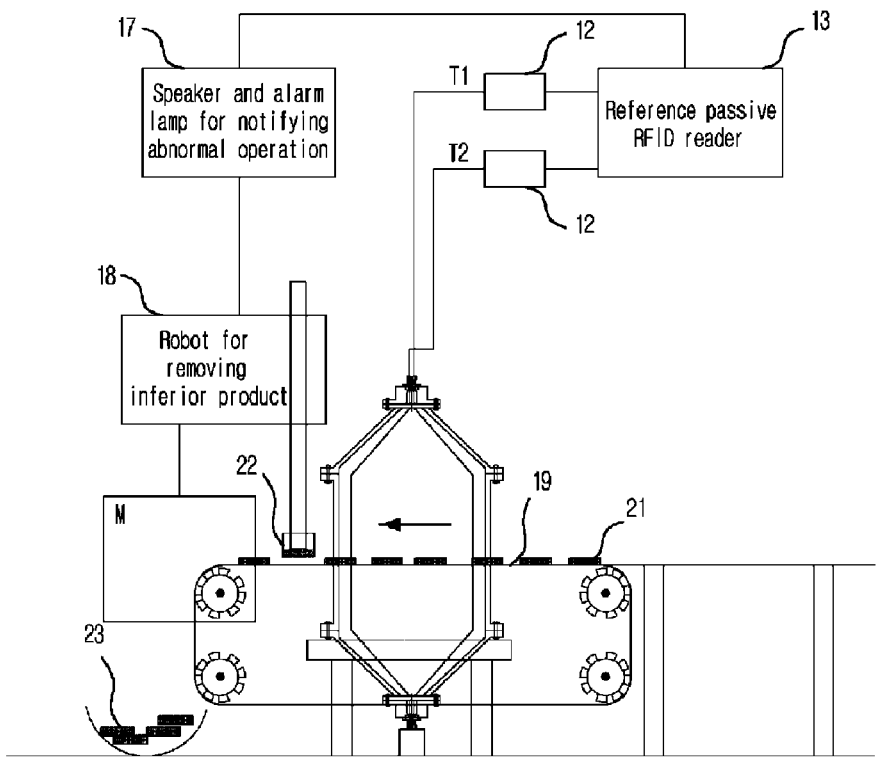
FIG. 11 is a schematic view illustrating an apparatus for identifying an inferior passive RFID transponder using a CTL cell in accordance with the second embodiment of the present invention.
Figure 12:
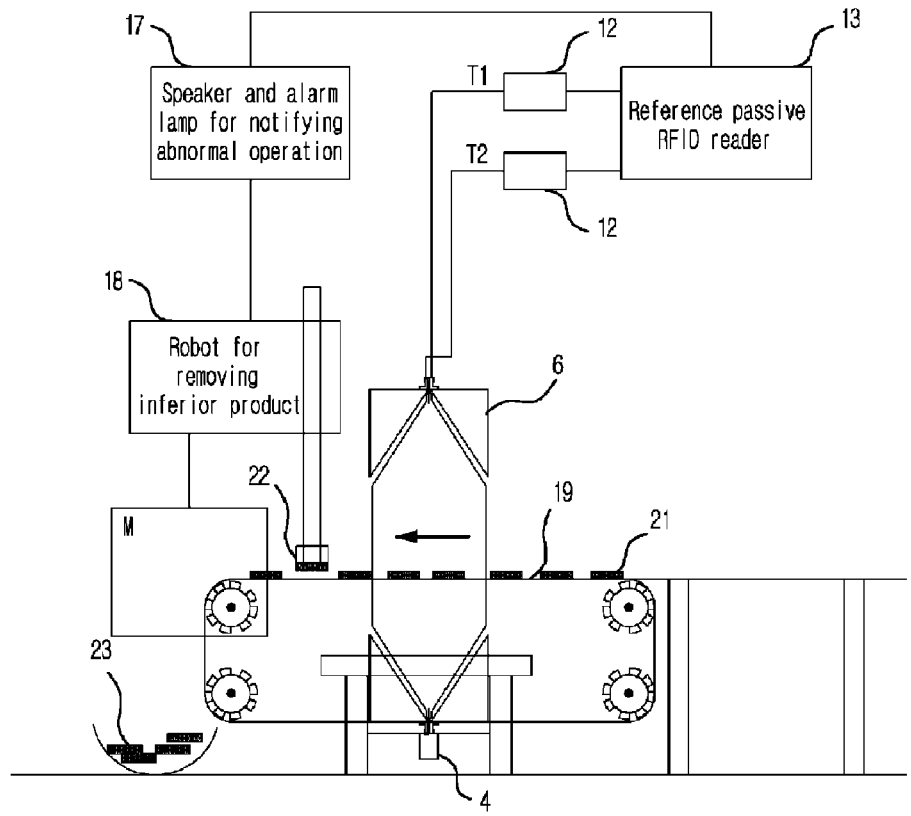
FIG. 12 is a schematic view illustrating an apparatus for identifying an inferior passive RFID transponder using a 4-terminal strip line cell in accordance with the second embodiment of the present invention.

FIGS. 10 to 12 illustrate apparatuses for identifying an inferior passive RFID transponder in accordance with a second embodiment of the present invention.

In accordance with the second embodiment of the present invention, each of the apparatuses for identifying the inferior passive RFID transponder connects attenuators 12 to each of an input terminal T1 and an output terminal T3 of a coupler, connects a passive RFID reader 13 which is normally operated to the attenuators 12, installs a passive RFID transponder 16 which is a test object in the coupler, and identifies an inferior product 22 by using the method for measuring the inverse scattering wave.

In the above arrangement, a robot 18 is further configured to identify inferiority of the passive RFID transponder 16 through the passive RFID reader 13 which is normally operated, and remove the inferior RFID transponder 22. The coupler is comprised of any one of a 2-terminal GTEM cell, a CTL cell and a 4-terminal strip line cell.

FIG. 10 illustrates an apparatus for identifying an inferior passive RFID transponder using a 2-terminal GTEM cell which does not have a distribution resistance plate by applying the same principle as above.

It is designed in such a way that one terminal of the 2-terminal GTEM cell is used as a feeding terminal, and the other terminal is used as a receiving terminal.

There is installed a reference model which is a passive RFID reader 13 having verified performance and isolable transmitting/receiving antenna. Specifically, an attenuator 12 is installed between the feeding terminal of the 2-terminal GTEM cell and a transmitting terminal (transmitting antenna coupling terminal) of the reader 13. This serves to attenuate wave loss caused by the positions of the reader 13 and the transponder 16. Further, an attenuator 12 is also installed between the receiving terminal (receiving antenna coupling terminal) of the 2-terminal GTEM cell and a receiving terminal of the reader 13. This functions to attenuate wave loss generated in a process of transmitting an inverse scattering signal to a receiving unit of the reader 13. In this case, the sensitivity measurement of the transponder 16 can be conducted, as done in a radio dark room. For example, in case where 910 MHz RFID transponder antenna operated in 5 m is provided and an apparatus for identifying an inferior transponder antenna is formed therein, if a reference reader incorporates therein a transmitting/receiving antenna having 4 Watts of Effective Isotropically Radiared Power (EIRP) and 6 dB of gain as defined in Korea standardization, it can be seen that a value obtained by subtracting the transmitting antenna gain (6 dB) from spatial loss (25 dB) generated due to wave radiation to the space using the antenna should be 19 dB and the transmitting power should be 1 Watt, and thus, power density in 5 m point is −19 dBW/m. Further, in case where the 2-terminal GTEM cell (or CTL cell) in which a distance d between inner conductors is 1 m is used, if 1 Watt is fed as input, power density is −8.7 dBW/m in the uniform area. Therefore, it can be easily found that an attenuation value of the attenuator 12 installed in the input terminal T1 of FIG. 10 must be maintained as 10.3 dB in order to keep the same power density in the space. If the attenuator 12 installed in the output terminal T3 also maintains the same value, it is possible to identify the RFID transponder 16 which is not operated in the distance 5 m.

Conversely, an attenuation value of the attenuator 12 for maintaining the operation can be obtained. Also, a maximum operating distance can be measured by calculating a maximum attenuation value for maintaining the operation on the basis of the above attenuation value.

$$R = \left(\frac{10^{Gr/10} d^2 \eta_0}{4\pi Z_c 10^{-a/10}}\right)^{0.5} \qquad \text{Eq. (1)}$$

When the transponder is installed in the 2-terminal GTEM cell (or CTL cell) in which the characteristic impedance is $Z_c(W)$ and the distance between the inner conductors is d (see FIGS. 2 to 5), and when the maximum attenuation value for maintaining the normal operation of the reader using the transmitting/receiving antenna having a gain of Gr(dB) is a(dB), the operating distance R(m) in the free space can be easily obtained by Eq. (1) above.

Also, when the operating distance is acquired by Eq. (1), the attenuation value a(dB) of the attenuator for obtaining the same electromagnetic wave condition as that of the free space can be easily determined inversely.

In FIG. 10, a test object transponder 21 which is normally read by the reader 13 is not an inferior product 22 but a finished product 23, and thus is passed as it is. If the transponder 21 is not read by the reader 13, a speaker and an alarm lamp 17 for notifying an abnormal operation are operated, so that the operator can remove the inferior transponder, or the robot 18 for removing the inferior transponder is installed to thereby automatically remove it. This system may be easily implemented by a control system using a computer as a whole.

FIG. 11 illustrates an apparatus for identifying an inferior passive RFID transponder using a CTL cell.

In two terminals installed on one surface of the CTL cell having four terminals, one is used as a feeding terminal, and the other is used as a receiving terminal.

Terminals installed on the opposite surface are terminated by being connected to terminators 4. In addition, there is installed a reference model which is a passive RFID reader 13 having verified performance and isolable transmitting/receiving antenna. Specifically, an attenuator 12 is installed between the feeding terminal of the CTL cell and a transmitting terminal (transmitting antenna coupling terminal) of the reader 13 for attenuating wave loss caused by the positions of the reader 13 and the transponder 16. Further, an attenuator 12 is also installed between the receiving terminal (receiving antenna coupling terminal) of the CTL cell and a receiving terminal of the reader 13 for attenuating wave loss generated in a process of transmitting an inverse scattering signal to a receiving unit of the reader 13.

In this case, the sensitivity measurement of the transponder 16 can be conducted, as done in a radio dark room.

An attenuation value is defined as in the example of FIG. 10. An attenuation value of the attenuator 12 for maintaining the operation can be also calculated inversely. As described above, a maximum operating distance can be measured based on the attenuation value.

A test object transponder 21 which is normally read by the reader 13 is not an inferior product 22 but a finished product 23, and thus is passed as it is. If the transponder 21 is not read by the reader 13, a speaker and an alarm lamp 17 for notifying an abnormal operation are operated, so that the operator can remove the inferior transponder, or a robot 18 for removing an inferior product is installed to thereby automatically remove it. This system can be easily embodied by a control system using a computer as a whole.

FIG. 12 illustrates an apparatus for identifying an inferior passive RFID transponder using a 4-terminal strip line cell.

Identically to the CTL cell as described above, out of two terminals installed on one surface of the 4-terminal strip line cell having four terminals, one is used as a feeding terminal, and the other is used as a receiving terminal.

In addition, there is installed a reference model which is a passive RFID reader 13 having verified performance and isolable transmitting/receiving antenna. Specifically, an attenuator 12 is installed between the feeding terminal of the 4-terminal strip line cell and a transmitting terminal (transmitting antenna coupling terminal) of the reader 13 for attenuating wave loss caused by the positions of the reader 13 and the transponder 16. Further, an attenuator 12 is also installed between the receiving terminal (receiving antenna coupling terminal) of the 4-terminal strip line cell and a receiving terminal of the reader 13 for attenuating wave loss generated in a process of transmitting an inverse scattering signal to a receiving unit of the reader 13.

In this case, the sensitivity measurement of the transponder 16 can be conducted, as done in a radio dark room.

An attenuation value is defined as in the example of FIG. 10. An attenuation value of the attenuator 12 for maintaining the operation can be also found inversely. As described above, a maximum operating distance can be measured on the basis of the attenuation value.

A test object transponder 21 which is normally read by the reader 13 is not an inferior product 22 but a finished product 23, and thus is passed as it is. If the transponder 21 is not read by the reader 13, a speaker and an alarm lamp 17 for notifying an abnormal operation are operated, so that the operator can remove the inferior transponder, or a robot 18 for removing an inferior product is installed to thereby automatically remove it. This system can be easily built by a control system using a computer as a whole.

Figure 13:
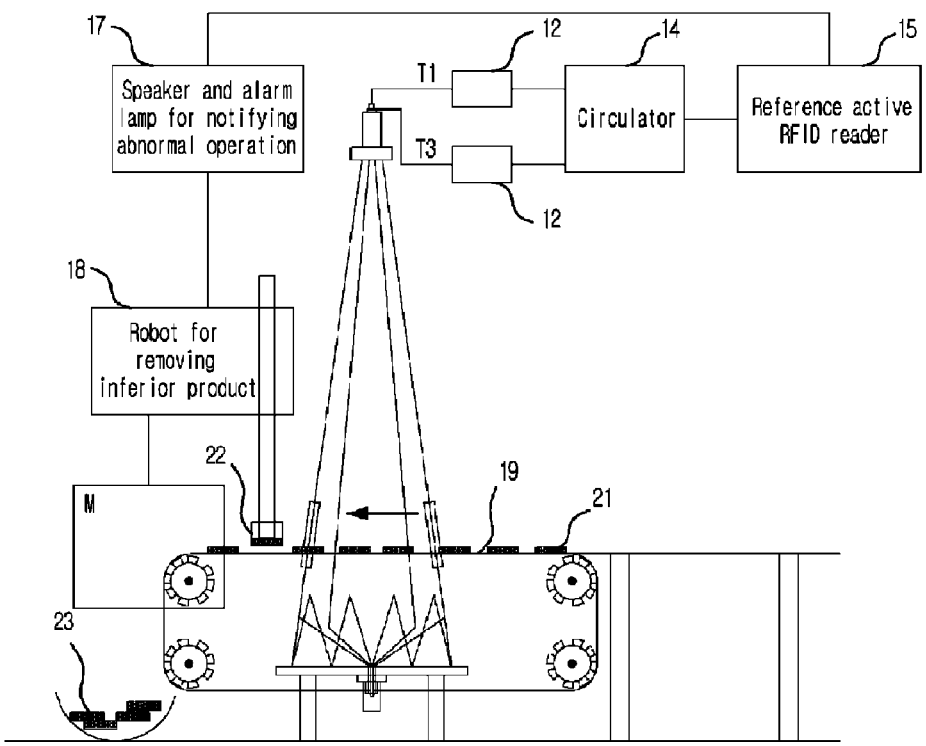
FIG. 13 is a schematic view illustrating an apparatus for identifying an inferior active RFID transponder using a 2-terminal GTEM cell which does not have a distribution resistance plate in accordance with a third embodiment of the present invention.
Figure 14:
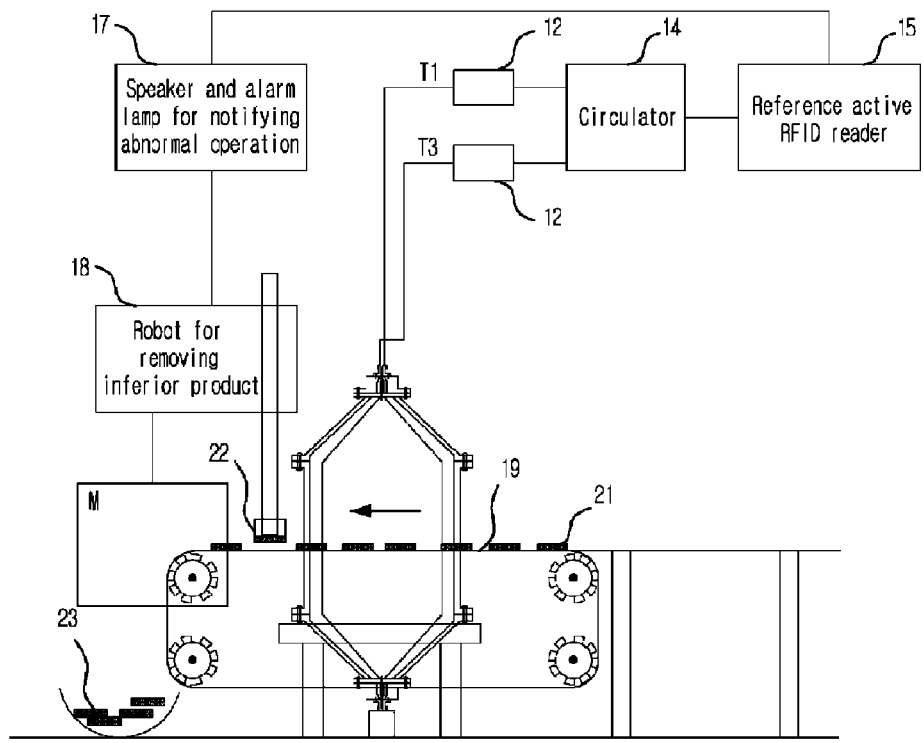
FIG. 14 is a schematic view illustrating an apparatus for identifying an inferior active RFID transponder using a CTL cell in accordance with the third embodiment of the present invention.
Figure 15:
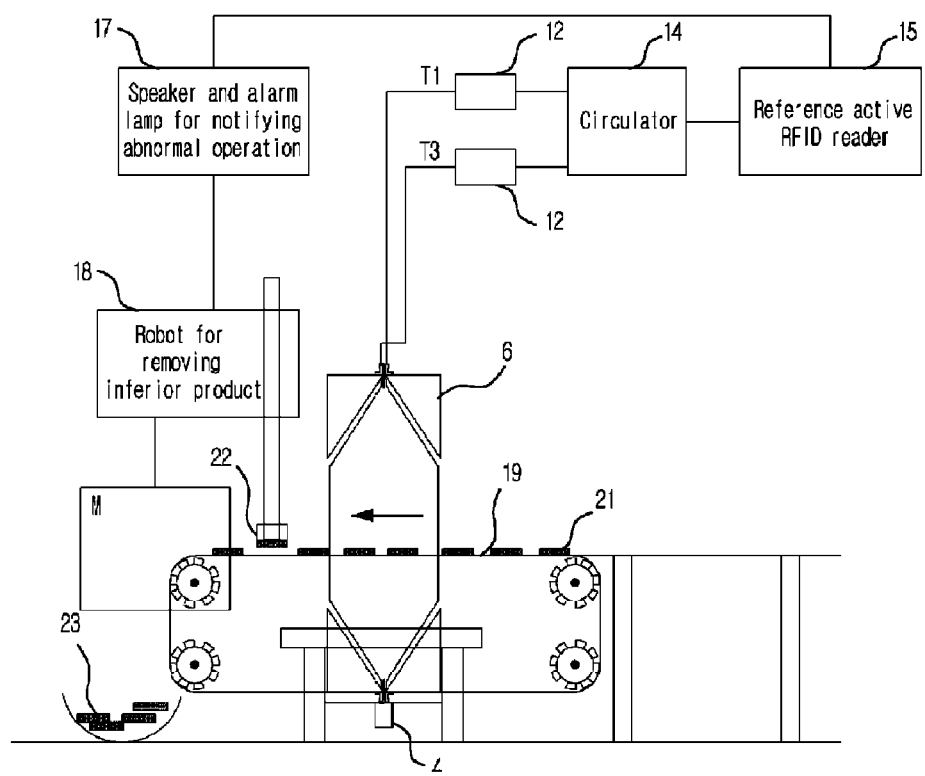
FIG. 15 is a schematic view illustrating an apparatus for identifying an inferior active RFID transponder using a 4-terminal strip line cell in accordance with the third embodiment of the present invention.

FIGS. 13 to 15 illustrate apparatuses for identifying an inferior active RFID transponder in accordance with a third embodiment of the present invention.

In accordance with the third embodiment of the present invention, each of the apparatuses for identifying the inferior active RFID transponder connects attenuators 12 to each of an input terminal T1 and an output terminal T3 of a coupler, connects a circulator 14 to the attenuators 12, connects an active RFID reader 15 which is normally operated to the circulator 14, installs an active RFID transponder 16 which is a test object in the coupler, and identifies an inferior product 22 by using the method for measuring the inverse scattering wave.

In addition, a robot 18 identifies inferiority of the active transponder 16 through the active RFID reader 13 which is normally operated, and removes the inferior active RFID transponder 22. The coupler is comprised of any one of a 2-terminal GTEM cell, a CTL cell and a 4-terminal strip line cell.

FIG. 13 illustrates an apparatus for identifying an inferior active RFID transponder using a 2-terminal GTEM cell which does not have a distribution resistance plate.

It is designed in such a way that one terminal of the 2-terminal GTEM cell is used as a feeding terminal, and the other terminal is used as a receiving terminal.

In addition, there is installed a reference model which is an active RFID reader 15 having verified performance and one transmitting/receiving antenna. Specifically, an attenuator 12 and a circulator 14 are installed between the feeding terminal of the 2-terminal GTEM cell and a transmitting terminal of the reader 13 for attenuating wave loss caused by the positions of the reader 15 and the transponder 16. Further, an attenuator 12 and the circulator 14 are also installed between the receiving terminal of the 2-terminal GTEM cell and a receiving terminal of the reader 15 for attenuating wave loss generated in a process of transmitting an inverse scattering signal to a receiving unit of the reader 15.

In this arrangement, the sensitivity measurement of the transponder 16 can be conducted, as done in a radio dark room.

A test object transponder 21 which is normally read by the reader 15 is not an inferior product 22 but a finished product 23, and thus is passed as it is. If the transponder 21 is not read by the reader 15, a speaker and an alarm lamp 17 for notifying an abnormal operation are operated, and a robot 18 for removing an inferior product is installed to thereby automatically remove it.

If a connecting terminal can be formed to connect transmitting and receiving signal lines from the active RFID reader 15 to the antenna, it can be installed as shown in FIG. 10.

FIG. 14 illustrates an apparatus for identifying an inferior active RFID transponder using a CTL cell.

It is designed in such a way that one terminal of the CTL cell is used as a feeding terminal, and the other terminal is used as a receiving terminal.

In addition, there is installed a reference model which is an active RFID reader 15 having verified performance and one transmitting/receiving antenna. Specifically, an attenuator 12 and a circulator 14 are installed between the feeding terminal of the CTL cell and a transmitting terminal of the reader 15 for attenuating wave loss caused by the positions of the reader 15 and the transponder 16. Further, an attenuator 12 and the circulator 14 are also installed between the receiving terminal of the CTL cell and a receiving terminal of the reader 15 for attenuating wave loss generated in a process of transmitting an inverse scattering signal to a receiving unit of the reader 15.

In this case, the sensitivity measurement of the transponder 16 can be conducted, as done in a radio dark room.

A test object transponder 21 which is normally read by the reader 15 is not an inferior product 22 but a finished product 23, and thus is passed as it is. If the transponder 21 is not read by the reader 15, a speaker and an alarm lamp 17 for notifying an abnormal operation are operated, and a robot 18 for removing an inferior product is installed to thereby automatically remove it. If a connecting terminal can be formed to connect transmitting and receiving signal lines from the active RFID reader 15 to the antenna, it can be installed as shown in FIG. 11.

FIG. 15 illustrates an apparatus for identifying an inferior active RFID transponder using a 4-terminal strip line cell.

It is designed in such a manner that one terminal of the 4-terminal strip line cell is used as a feeding terminal, and the other terminal is used as a receiving terminal.

In addition, there is installed a reference model which is an active RFID reader 15 having verified performance and one transmitting/receiving antenna. Specifically, an attenuator 12 and a circulator 14 are installed between the feeding terminal of the 4-terminal strip line cell and a transmitting terminal of the reader 15 for attenuating wave loss caused by the positions of the reader 15 and the transponder 16. Further, an attenuator 12 and the circulator 14 are also installed between the receiving terminal of the 4-terminal strip line cell and a receiving terminal of the reader 15 for attenuating wave loss generated in a process of transmitting an inverse scattering signal to a receiving unit of the reader 15.

In this case, the sensitivity measurement of the transponder 16 can be conducted, as done in a radio dark room.

A test object transponder 21 which is normally read by the reader 15 is not an inferior product 22 but a finished product 23, and thus is passed at it is. In case where the transponder 21 is not read by the reader 15, a speaker and an alarm lamp 17 for notifying an abnormal operation are operated, and a robot 18 for removing an inferior product is installed to thereby automatically remove it. If a connecting terminal can be formed to connect transmitting and receiving signal lines from the active RFID reader 15 to the antenna, it can be installed as shown in FIG. 12.

Figure 16:
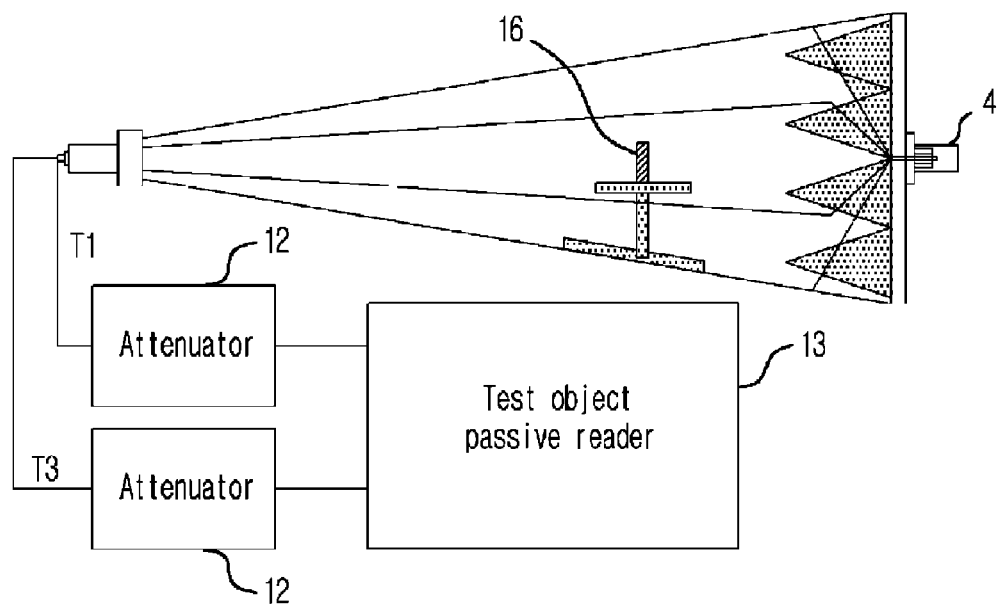
FIG. 16 is a schematic view illustrating an apparatus for identifying an inferior passive RFID reader using a 2-terminal GTEM cell which does not have a distribution resistance plate in accordance with a fourth embodiment of the present invention.
Figure 17:
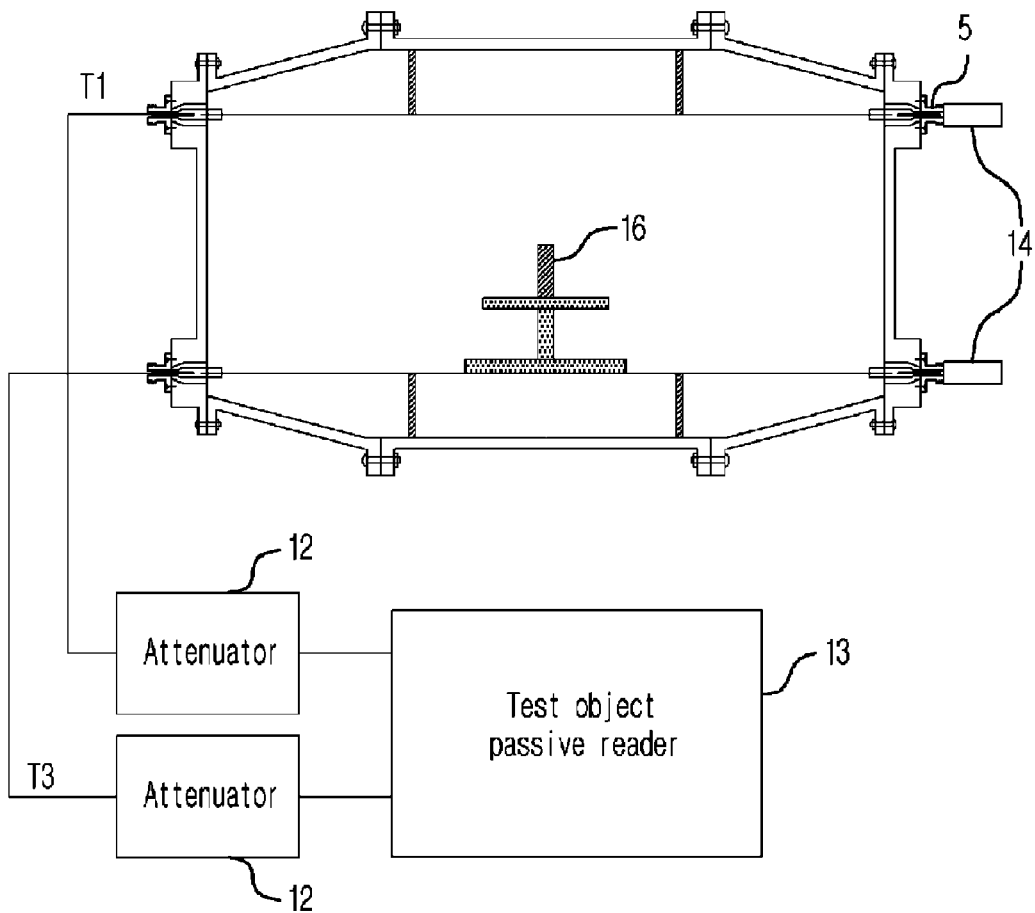
FIG. 17 is a schematic view illustrating an apparatus for identifying an inferior passive RFID reader using a CTL cell in accordance with the fourth embodiment of the present invention.
Figure 18:
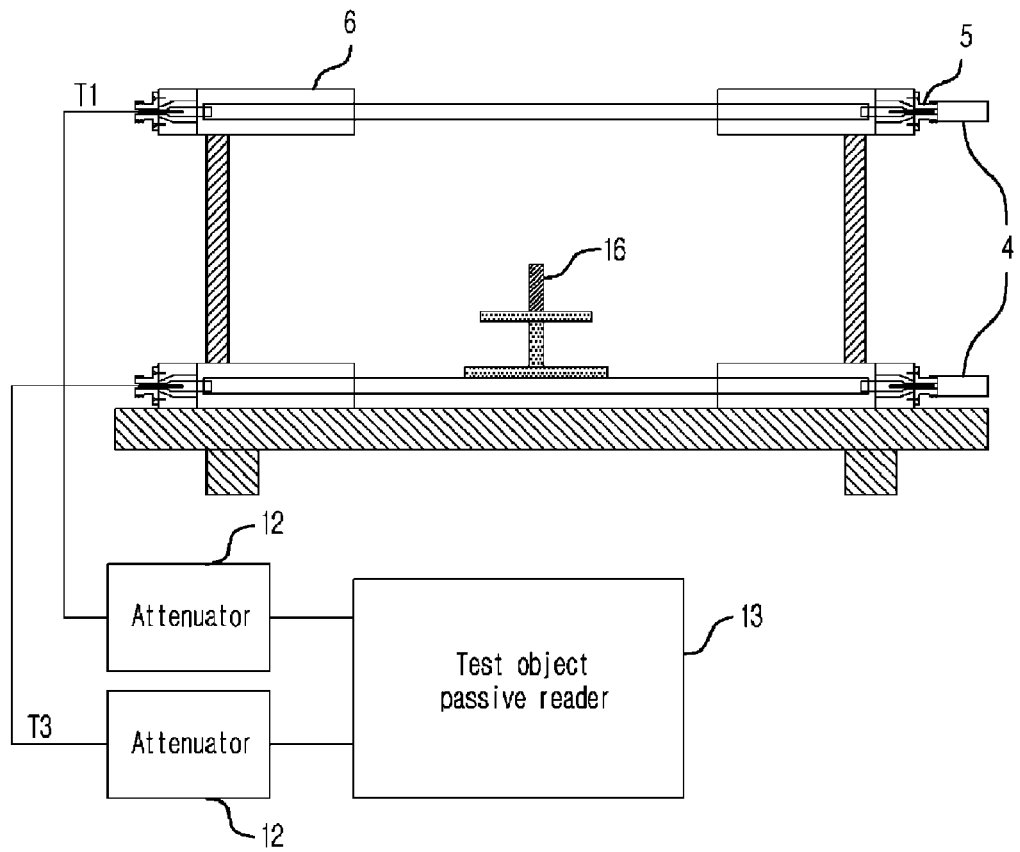
FIG. 18 is a schematic view illustrating an apparatus for identifying an inferior passive RFID reader using a 4-terminal strip line cell in accordance with the fourth embodiment of the present invention.

FIGS. 16 to 18 illustrate apparatuses for identifying an inferior passive RFID reader in accordance with a fourth embodiment of the present invention.

In accordance with the fourth embodiment of the present invention, each of the apparatuses for identifying the inferior passive RFID reader installs a passive transponder 16 which is normally operated in a coupler, connects attenuators 12 to each of an input terminal T1 and an output terminal T3 of the coupler, installs an RFID reader 13 which is a test object in the attenuators 12, and identifies an inferior product by using the method for measuring the inverse scattering wave. The coupler is comprised of any one of a 2-terminal GTEM cell, a CTL cell and a 4-terminal strip line cell.

FIG. 16 illustrates an apparatus for identifying an inferior passive RFID reader using a 2-terminal GTEM cell which does not have a distribution resistance plate. Here, a transmitting antenna and a receiving antenna are used separately from each other.

The apparatus for identifying the inferior passive RFID reader installs a transponder 16 having verified performance in an inside uniform area, adjusts or selects attenuation values of the attenuators 12 as in FIG. 10, installs a passive RFID reader 13 which is a test object, and checks a normal operation thereof, thereby identifying an inferior product 22.

FIG. 17 illustrates an apparatus for identifying an inferior passive RFID reader using a CTL cell. Here, a transmitting antenna and a receiving antenna are used separately from each other.

The apparatus for identifying the inferior passive RFID reader installs a transponder 16 having verified performance in an inside uniform area, adjusts or selects attenuation values of attenuators 12 as in FIG. 11, installs a passive RFID reader 13 which is a test object, and checks a normal operation thereof, thereby identifying an inferior product 22.

FIG. 14 illustrates an apparatus for identifying an inferior passive RFID reader using a 4-terminal strip line cell. Here, a transmitting antenna and a receiving antenna are used separately from each other.

The apparatus for identifying the inferior passive RFID reader installs a transponder 16 having verified performance in an inside uniform area, adjusts or selects attenuation values of attenuators 12 as in FIG. 12, installs a passive RFID reader 13 which is a test object, and checks a normal operation thereof, thereby identifying an inferior product 22.

Figure 19:
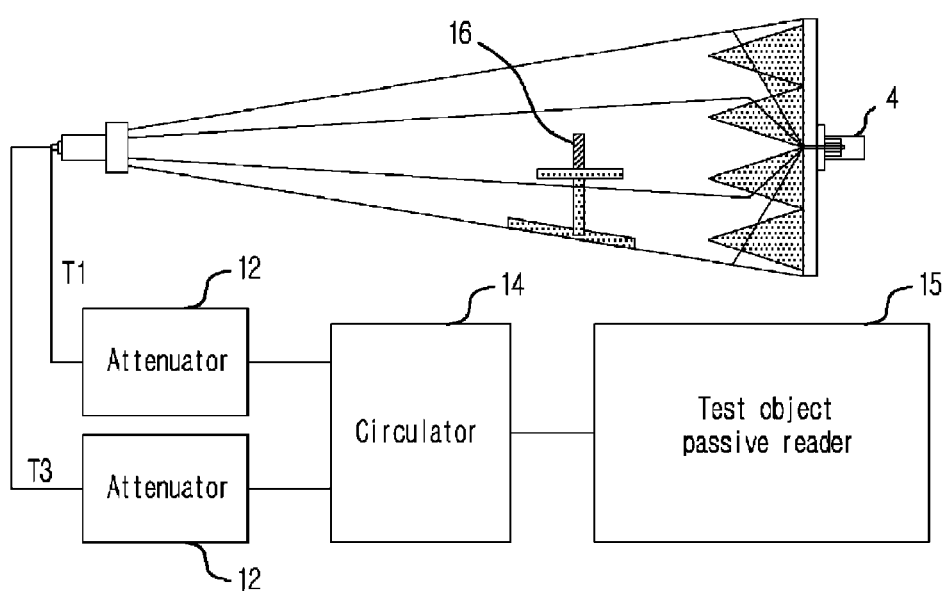
FIG. 19 is a schematic view illustrating an apparatus for identifying an inferior active RFID reader using a 2-terminal GTEM cell which does not have a distribution resistance plate in accordance with a fifth embodiment of the present invention.
Figure 20:
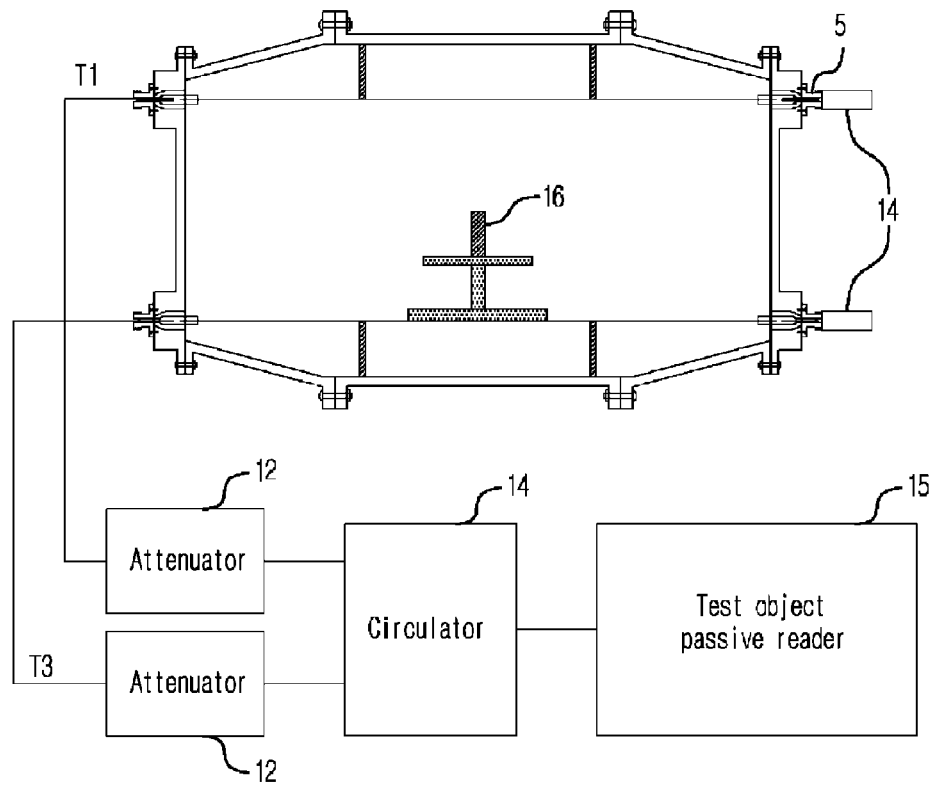
FIG. 20 is a schematic view illustrating an apparatus for identifying an inferior active RFID reader using a CTL cell in accordance with the fifth embodiment of the present invention.
Figure 21:
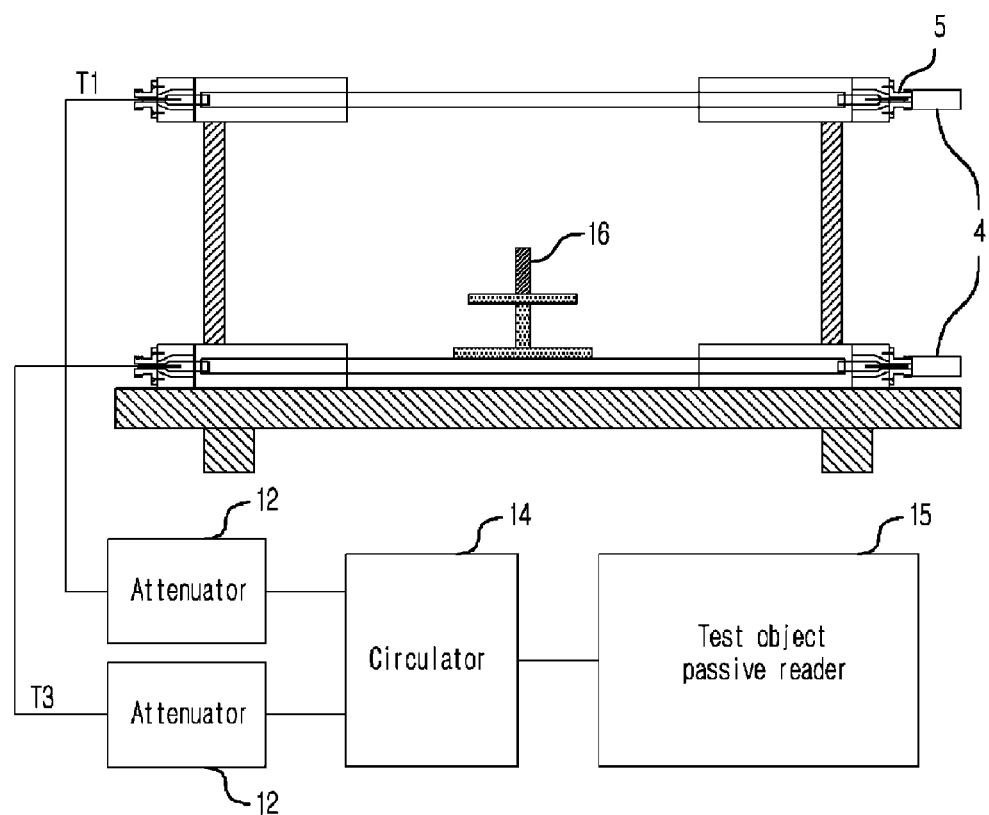
FIG. 21 is a schematic view illustrating an apparatus for identifying an inferior active RFID reader using a 4-terminal strip line cell in accordance with the fifth embodiment of the present invention.

FIGS. 19 to 21 illustrate apparatuses for identifying an inferior active RFID reader in accordance with a fifth embodiment of the present invention.

In accordance with the fifth embodiment of the present invention, each of the apparatuses for identifying the inferior active RFID reader installs an active transponder 16 which is normally operated in a coupler, connects attenuators 12 to each of an input terminal T1 and an output terminal T3 of the coupler, connects a circulator 14 to the attenuators 12, installs an active RFID reader 15 which is a test object in the circulator 14, and identifies an inferior product by using the method for measuring the inverse scattering wave.

The coupler is comprised of any one of a 2-terminal GTEM cell, a CTL cell and a 4-terminal strip line cell.

FIG. 19 illustrates an apparatus for identifying an inferior active RFID reader using a 2-terminal GTEM cell which does not have a distribution resistance plate, especially, an apparatus for identifying an inferior active RFID reader which is a test object using one transmitting/receiving antenna and separately connecting an antenna feeding terminal. The operating principle of the apparatus is identical to that of the apparatus of FIG. 16.

FIG. 20 illustrates an apparatus for identifying an inferior active RFID reader using a CTL cell, especially, an apparatus for identifying an inferior active RFID reader using one transmitting/receiving antenna and separately connecting an antenna feeding terminal. The operating principle of the apparatus is identical to that of the apparatus of FIG. 17.

FIG. 21 illustrates an apparatus for identifying an inferior active RFID reader using a 4-terminal strip line cell, especially, an apparatus for identifying an inferior active RFID reader using one transmitting/receiving antenna and separately connecting an antenna feeding terminal. The operating principle of the apparatus is identical to that of the apparatus of FIG. 18.

The present application contains subject matter related to Korean patent application No. 2005-120460, filed in the Korean Intellectual Property Office on Dec. 9, 2005, the entire contents of which are incorporated herein by reference.

While the present invention has been described with respect to certain preferred embodiments, it will be apparent to those skilled in the art that various changes and modifications may be made without departing from the scope of the invention as defined in the following claims.

The invention claimed is:

1. A method for measuring inverse scattering wave, comprising the steps of:
   installing a scattering object which is a test object in a coupler;
   feeding an electrical signal to an input terminal of the coupler;
   terminating an output terminal and an isolation terminal of the coupler so that the electrical signal scattered by colliding with the scattering object is transmitted to a coupling terminal of the coupler; and
   measuring intensity of the electrical signal transmitted to the coupling terminal.

2. The method as recited in claim 1, wherein the electrical signal is an RF power signal.

3. The method as recited in claim 1, wherein the coupler is implemented in such a manner that uniformity of electromagnetic wave is high in $1/3$ center portion between inner conductors provided in the coupler.

4. The method as recited in claim 1, wherein the electrical signal is measured by using any one of a 2-terminal Gigahertz Transverse Electro Magnetic (GTEM) cell, a Coupled Transmission Line (CTL) cell, a strip line cell and an 8-terminal TEM cell which have a coupler structure.

5. An apparatus for identifying an inferior passive Radio Frequency IDentification (RFID) transponder, comprising:
- attenuators connected to each of an input terminal and an output terminal of a coupler;
- a passive RFID reader, which is normally operated, connected to the attenuators; and
- a passive RFID transponder, which is a test object, installed in the coupler,
- whereby an inferior product is identified by using the method for measuring the inverse scattering wave as recited in claim 1.

6. The apparatus as recited in claim 5, further comprising a robot for identifying inferiority of the passive RFID transponder through the passive RFID reader which is normally operated, and removing the inferior RFID transponder.

7. The apparatus as recited in claim 5, wherein the coupler is comprised of any one of a 2-terminal GTEM cell, a CTL cell and a 4-terminal strip line cell.

8. An apparatus for identifying an inferior active RFID transponder, comprising:
- attenuators connected to each of an input terminal and an output terminal of a coupler;
- a circulator connected to the attenuators;
- an active RFID reader, which is normally operated, connected to the circulator; and
- an active RFID transponder, which is a test object, installed in the coupler, whereby an inferior product is identified by using the method for measuring the inverse scattering wave as recited in claim 1.

9. The apparatus as recited in claim 8, further comprising a robot for identifying inferiority of the active RFID transponder through the active RFID reader which is normally operated, and removing the inferior active RFID transponder.

10. The apparatus as recited in claim 8, wherein the coupler is comprised of any one of a 2-terminal GTEM cell, a CTL cell and a 4-terminal strip line cell.

11. An apparatus for identifying an inferior passive RFID reader, comprising:
- a passive transponder, which is normally operated, installed in a coupler;
- attenuators connected to each of an input terminal and an output terminal of the coupler; and
- an RFID reader, which is a test object, installed in the attenuators, whereby an inferior product is identified by using the method for measuring the inverse scattering wave as recited in claim 1.

12. The apparatus as recited in claim 11, wherein the coupler is comprised of any one of a 2-terminal GTEM cell, a CTL cell and a 4-terminal strip line cell.

13. An apparatus for identifying an inferior active RFID reader, comprising:
- an active transponder, which is normally operated, installed in a coupler;
- attenuators connected to each of an input terminal and an output terminal of the coupler;
- a circulator connected to the attenuators; and
- an active RFID reader, which is a test object, installed in the circulator, whereby an inferior product is identified by using the method for measuring the inverse scattering wave as recited in claim 1.

14. The apparatus as recited in claim 13, wherein the coupler is comprised of any one of a 2-terminal GTEM cell, a CTL cell and a 4-terminal strip line cell.

15. A method for measuring forward scattering wave, comprising the steps of:
- installing a scattering object which is a test object in a coupler;
- feeding an electrical signal to an input terminal of the coupler;
- terminating an output terminal and a coupling terminal of the coupler so that the electrical signal scattered by colliding with the scattering object is transmitted to an isolation terminal of the coupler; and
- measuring intensity of the electrical signal transmitted to the isolation terminal.

16. The method as recited in claim 15, wherein the electrical signal is an RF power signal.

17. The method as recited in claim 15, wherein the electrical signal is measured by using any one of a 2-terminal GTEM cell, a CTL cell, a strip line cell and an 8-terminal TEM cell which have a coupler structure.

* * * * *